United States Patent [19]

Knutson et al.

[11] Patent Number: 5,943,369
[45] Date of Patent: Aug. 24, 1999

[54] TIMING RECOVERY SYSTEM FOR A DIGITAL SIGNAL PROCESSOR

[75] Inventors: Paul Gothard Knutson; Kumar Ramaswamy; David Lowell McNeely, all of Indianapolis, Ind.

[73] Assignee: Thomson Consumer Electronics, Inc., Indianapolis, Ind.

[21] Appl. No.: 08/721,780

[22] Filed: Sep. 25, 1996

Related U.S. Application Data

[60] Provisional application No. 60/012,339, Feb. 27, 1996.

[51] Int. Cl.$^6$ .............................. H03D 3/00; H04L 27/06
[52] U.S. Cl. ........................... 375/326; 375/355; 348/725
[58] Field of Search .................................... 348/512, 725; 375/326, 327, 355, 340, 344, 345, 350, 354

[56] References Cited

U.S. PATENT DOCUMENTS

| | | | |
|---|---|---|---|
| 5,400,368 | 3/1995 | Cheng et al. | 375/354 |
| 5,588,025 | 12/1996 | Strolle et al. | 375/316 |
| 5,666,170 | 9/1997 | Stewart | 348/726 |
| 5,671,257 | 9/1997 | Cochran et al. | 375/355 |
| 5,696,639 | 12/1997 | Spurbech et al. | 360/5.1 |
| 5,717,619 | 2/1998 | Spurbeck et al. | 364/724.16 |

FOREIGN PATENT DOCUMENTS

WO95/26074  9/1995  WIPO .............................. H03D 1/24

OTHER PUBLICATIONS

Edward A. Lee et al., *Digital Communication*, © 1988 by Kluwer Academic Publishers, Chapter 15, pp. 560–586.

Floyd M. Gardner, *Interpolation in Digital Modems—Part I: Fundamentals*, IEEE Transactions on Communications, vol. 41, No. 3, Mar. 1993, pp. 501–507.

Lars Erup et al., *Interpolation in Digital Modems—Part II: Implementation and Performance*, IEEE Transactions on Communications, vol. 41, No. 6, Jun. 1993, pp. 998–1008.

*Primary Examiner*—Young T. Tse
*Attorney, Agent, or Firm*—Joseph S. Tripoli; Eric P. Herrmann; Ronald H. Kurdyla

[57] ABSTRACT

A timing recovery system for a digital signal receiver receives a signal, representing successive symbols, from a transmitter. The symbols are subject to exhibiting multiple symbol rates. The system derives a sample enable signal from the received input signal and employs a single, fixed frequency oscillator. A source of samples representing the received signal are sampled at a fixed frequency. An interpolator is coupled to the sample source and is responsive to a control signal. The interpolator produces samples taken at times synchronized to the successive symbols from the transmitter. A phase error detector is coupled to the interpolator, detects a phase error between the sample times of the transmitter synchronized samples produced by the interpolator and times of the successive transmitter symbols, and supplies a phase error signal. The phase error signal is coupled to one input terminal of a summer and a source of a nominal delay signal is coupled to the other. A numerically controlled delay produces the control signal for the interpolator in response to the signal from the summer. An output signal from the interpolator is filtered by a fixed, non-adaptive pulse-shaping filter.

11 Claims, 4 Drawing Sheets

TIMING RECOVERY SYSTEM FOR A DIGITAL SIGNAL PROCESSOR

This application is a provision of Ser. No. 60/012,339 filed Feb. 27, 1996.

FIELD OF THE INVENTION

This invention concerns a digital signal processing system. In particular, the invention concerns a timing recovery system suitable for use in a digital signal receiver such as a television signal receiver.

BACKGROUND OF THE INVENTION

The recovery of data from a transmitted signal containing digital video and related information at a digital receiver typically requires the implementation of three functions: timing recovery for symbol synchronization, carrier recovery (frequency demodulation) and equalization. Timing recovery is the process by which the receiver clock (timebase) is synchronized to the transmitter clock. This permits the received signal to be sampled at the optimum point in time to reduce the chance of a slicing error associated with decision-directed processing of received symbol values. In some receivers, the received signal is sampled at a multiple of the transmitter symbol rate. For example, some receivers sample the received signal at twice the transmitter symbol rate.

In any event, the sampling clock of the receiver must be synchronized to the symbol clock of the transmitter.

Carrier recovery is the process by which a received RF signal, after being frequency shifted to a lower intermediate frequency passband, is frequency shifted to baseband to permit recovery of the modulating baseband information. Equalization is a process which compensates for the effects of transmission channel disturbances upon the received signal. More specifically, equalization removes intersymbol interference (ISI) caused by transmission channel disturbances. ISI causes the value of a given symbol to be distorted by the values of preceding and following symbols. These and related functions are described in greater detail by Lee and Messerschmitt in Digital Communication (Kluwer Academic Press, Boston, Mass., U.S.A.).

Prior receivers required a relatively stable source of a sampling clock signal, yet controllable so that it could be locked to the transmitter symbol clock. Voltage controlled crystal oscillators (VCXOs) were used for this function. The clock signal produced by a VCXO is stable, but controllable over a relatively narrow range, so that it can be locked to the transmitter symbol clock. However, a voltage controlled oscillator such as a VCXO is an analog component, so it is relatively expensive, and prone to drift over its lifetime. In addition, if it is necessary to receive signals from different transmitters having different symbol clock frequencies (such as in European satellite systems), it is necessary to have a separate VCXO for each such transmitter, further increasing the cost of the receiver.

It is desirable to provide a symbol timing recovery system which can support more than one symbol rate. It is furthermore recognized as desirable to provide such a timing recovery system which offers performance benefits and cost benefits such as in terms of hardware requirements, compared to known types of timing recovery systems, for example those including multiple VCXOs for each received symbol rate.

SUMMARY OF THE INVENTION

In accordance with principles of the present invention, a timing recovery system for a digital signal receiver, receives a signal, representing successive symbols, from a transmitter. An interpolator, coupled to the symbol source, responds to a control signal for producing samples taken at times synchronized to the successive symbols from the transmitter. A control network which provides the control signal includes a controlled delay network responsive to an output signal from said interpolator and to a nominal delay offset signal.

More specifically, the system comprises a source of samples representing the received signal, the samples taken at a fixed frequency. An interpolator is coupled to the sample source and is responsive to a control signal. The interpolator produces samples taken at times synchronized to the successive symbols from the transmitter. A phase error detector is coupled to the interpolator, detects a phase error between the sample times of the transmitter synchronized samples produced by the interpolator and times of the successive transmitter symbols, and supplies a phase error signal. The phase error signal is coupled to one input terminal of a summer and a source of a nominal delay signal is coupled to the other. A numerically controlled delay produces the control signal for the interpolator in response to the signal from the summer.

A timing recovery system according to the present invention operates by initially sampling the received signal at a fixed frequency slightly higher than twice the highest desired transmitter symbol rate. This initially sampled signal is then processed by an interpolator to generate a sequence of samples synchronized to the transmitter symbol rate. These synchronized samples are supplied to a digital phase error detector. The output of the digital phase error detector is supplied to a second order loop filter. A predetermined value, representing a desired nominal sampling time delay, is added to the output signal of the loop filter. The combination of the predetermined nominal delay and the output signal from the loop filter controls a numerically controlled delay which provides integer and fractional clock delay component signals. The integer portion of the clock delay component signal is used to control production of the receiver sampling clock signal synchronized to the transmitter symbol rate. This sampling clock signal may be further divided in frequency to provide a receiver symbol clock signal. The fractional portion of the delay component is applied to a control input of the interpolation filter so that the sampled signal produced by the interpolation filter represents the value of the received signal at the desired sampling time.

A timing recovery system according to the present invention advantageously supports variable symbol rate timing recovery without requiring the use of multiple analog voltage controlled crystal oscillators for symbol timing reference. This is accomplished by introducing the predetermined nominal delay into the timing control loop. A nominal delay register, which may be controlled by a processor in the receiver, permits the choice of any desired receiver sampling rate less than half the initial sampling rate. Problems associated with the use of multiple specific crystal oscillators for specific symbol rates, such as increased hardware complexity and cost, and acquisition time being dependent on how fast the crystal oscillator frequencies can be tuned, are avoided. The disclosed digital system performs the function of the voltage controlled crystal oscillator, advantageously allowing the use of a single fixed frequency oscillator.

For a receiver which samples the input signal at twice the transmitter symbol rate, a system according to the present invention supports any transmitter symbol rate lower than half the initial fixed sample rate. The required frequency accuracy is easily obtained with available crystals, because the tested pull-in range is greater than +/-1000 ppm. The system has been tested and shown to acquire timing lock in a relatively short period of time, revealing the constellation after 500 samples, and locking the constellation after a few thousand samples, even with a 1000 ppm timing offset. Performance advantages, combined with the elimination of a VCXO, make the system of the present invention attractive even in cases involving a single symbol rate.

More specifically, the disclosed system advantageously supports multiple symbol rates such as those which are used in European satellite applications. In the example discussed below, the receiver samples the input signal at twice the transmitter symbol rate. For example, the disclosed timing recovery system has been shown to support symbol rates of 20 million symbols per second (MSymbols/sec) to 30 MSymbols/sec using an initial sample clock frequency of 62 MHz. This gives initial sample clock frequency to symbol clock frequency ratios of 62/30 and 62/20. In these expressions the numerator is the initial sampling rate (MHz) and the denominator is the symbol rate (MSymbols/sec). Thus, in this case the recovery of both 20 MSymbols/sec and 30 MSymbols/sec symbol rates is supported by the use of a single fixed 62 MHz initial sampling clock frequency from a single fixed crystal controlled oscillator.

DETAILED DESCRIPTION OF THE DRAWING

Figure 1:
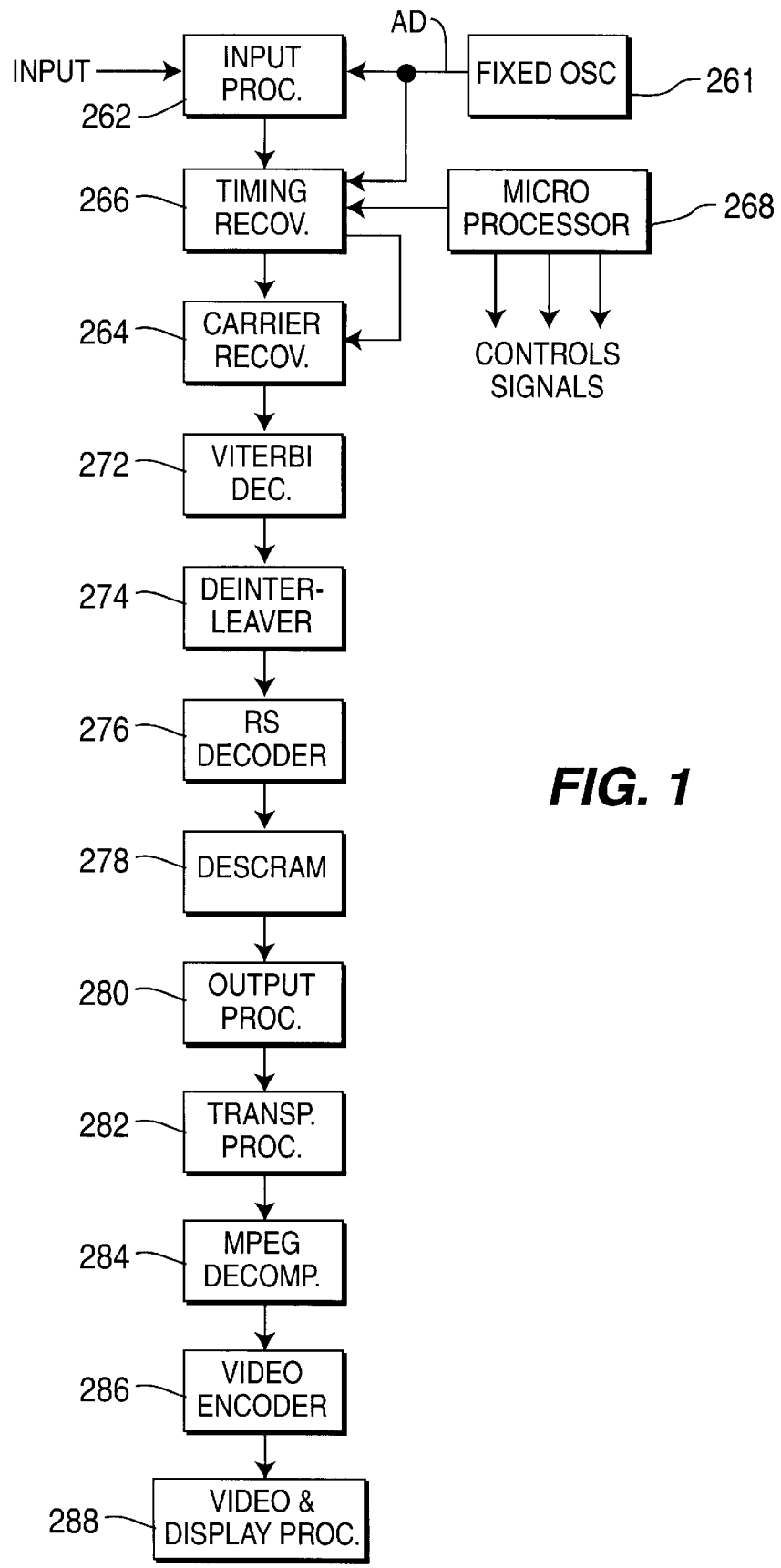
FIG. 1 is a block diagram representation of a receiver for a QPSK modulated input signal including a timing recovery network in accordance with principles of the present invention.

FIG. 1 is a block diagram of a receiver of a QPSK modulated input signal, e.g. a direct broadcast satellite receiver, including a timing recovery network in accordance with principles of the present invention. The blocks shown in FIG. 1 are conventional in function and arrangement, except for unit 266 which is a symbol timing recovery network according to the present invention.

An input terminal (INPUT) is coupled to a source (not shown) of a modulated QPSK signal, such as an antenna or cable connection. The input terminal (INPUT) is coupled to an input processor 262 which includes an input channel tuner, RF (radio frequency) amplifiers, an IF (intermediate frequency) amplifier and mixer stage for downconverting the input signal to a lower frequency band suitable for further processing, an automatic gain control network and an output analog-to-digital converter (ADC), none of which are shown, but all of which are arranged in a known manner. A fixed frequency oscillator 261, which may, for example, be a crystal oscillator, provides a fixed sampling frequency clock signal AD to the ADC, and to other circuit elements (e.g. timing recovery network 266) in a manner to be described in more detail below.

A near baseband output signal from unit 262 is provided to a timing recovery network 266 according to the invention. The timing recovery network 266 produces samples representing the transmitted signal which are synchronized to the transmitter symbol clock, and other timing signals, in a manner to be described in more detail below. In the illustrated embodiment, two samples are produced per transmitted symbol. The transmitter synchronized samples, and other timing signals, are provided to a carrier recovery network 264, which demodulates the signal to baseband, and includes an equalizer, rotator, slicer and phase error detector network, as well as a phase controller for controlling the equalizer and rotator operation, all as known. The baseband demodulated signal from the carrier recovery unit 264 is decoded by Viterbi decoder unit 272 and deinterleaved by deinterleaver unit 274 before having errors detected and corrected by the Reed-Solomon error detection and correction unit 276. The functions of these units are described, for example, in the Lee and Messerschmitt text mentioned previously, among others.

The error corrected signal from the Reed-Solomon error detection and correction unit 276 is optionally descrambled in descrambler unit 278. The signal from descrambler unit 278 is provided to an output processor 280, which supplies the functions necessary to interface the descrambled data to other signal processing networks. These functions include conforming the data to suitable logic levels and providing clock signals to facilitate interfacing with other networks. The data from output processor 280 is processed by an MPEG compatible transport processor 282, which provides synchronization and error indication information used in video data decompression, although MPEG compatibility is not essential in a system employing the present invention. Transport processor 282 also separates data according to type based on an analysis of header information. Output data from processor 282 are decompressed by MPEG decompressor 284 to provide video data suitable for encoding in a predetermined format, such as NTSC or PAL, for example, by video encoder unit 286. Output signals from video encoder unit 286 are applied to a video and display processor 288, which includes an image display device (not shown).

A system microprocessor 268 provides initialization parameters, and other control signals to the respective elements in the receiver in a known manner, including the timing recovery network 266. The specific parameter and control signals provided by the system microprocessor 268 to the timing recovery network 266 will be described in more detail below.

Figure 2:
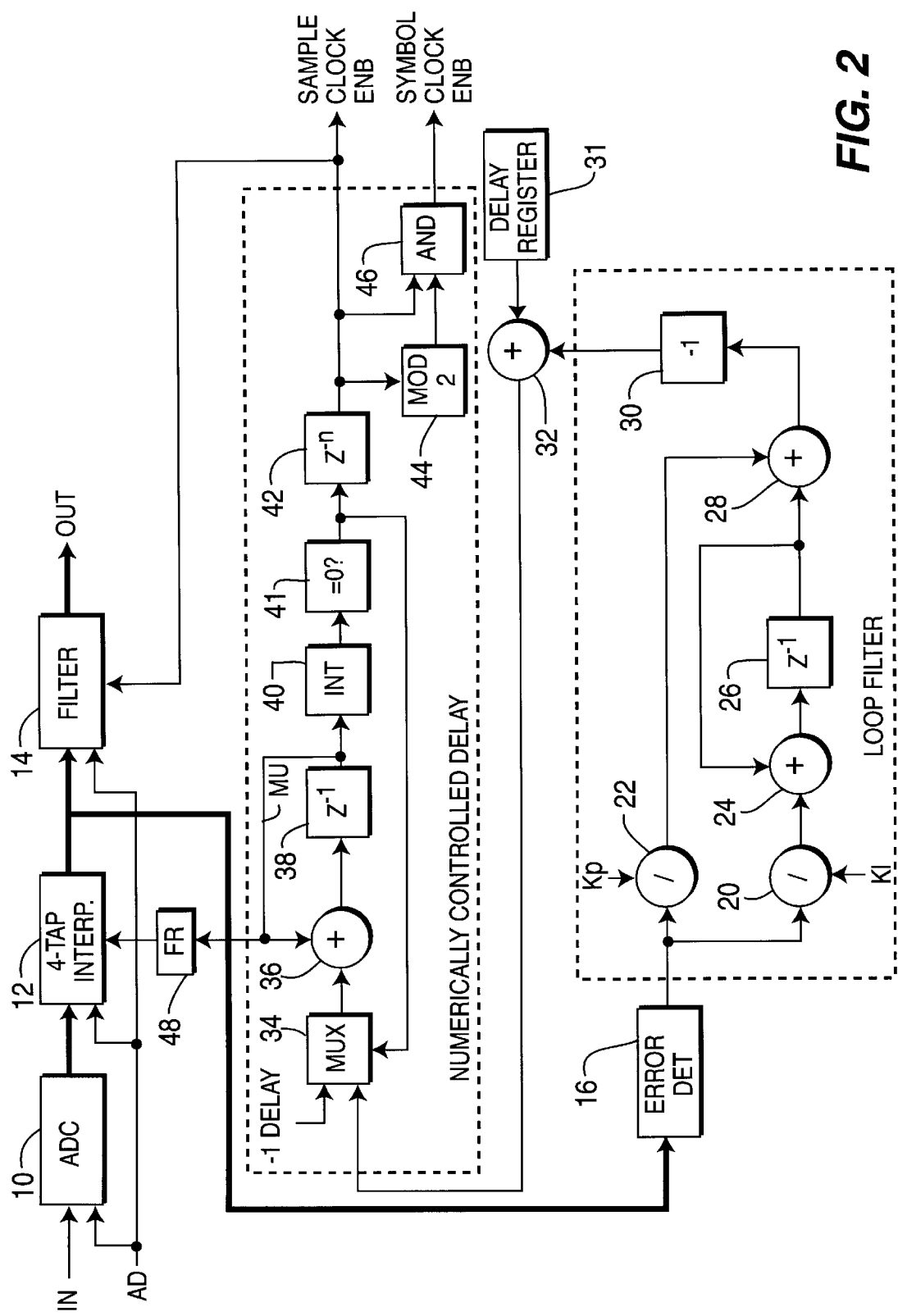
FIG. 2 is a block diagram of a symbol timing recovery system in accordance with principles of the present invention.

FIG. 2 is a more detailed block diagram of a symbol timing recovery system in accordance with the principles of the present invention. In FIG. 2, analog or simple digital signals are illustrated by thin lines, and complex digital signals, comprising real (in-phase) and imaginary (quadrature) component signals in a known manner, are illustrated as thick lines. In the symbol timing recovery system shown in FIG. 2, advantageous features include a nominal delay register which allows a designer to choose any desired symbol rate less than half the input sample rate, and the possibility of using a more accurate interpolator design for higher order constellations. The derivation of symbol and sample clock enable signals at the output of a numerically controlled delay operation advantageously permits a completely synchronous design without requiring analog components for phase and frequency locking.

In FIG. 2, an input analog signal IN, representing a received signal from a transmitter, is initially sampled and converted to complex digital form by an analog-to-digital converter (ADC) 10 (which is part of the input processor 262 in FIG. 1). ADC 10 is clocked by the initial fixed frequency sample clock AD generated locally by the fixed frequency crystal oscillator 261 (of FIG. 1). The complex digital datastream from ADC 10 is applied to a complex 4-tap interpolator 12 (described in more detail below) which also is clocked by the initial fixed frequency sample clock signal AD. The interpolation function described previously is essentially a timing adjustment function, and has sometimes been referred to as digital phase shifting and sampling rate conversion. The output of interpolator 12 is a stream of complex samples, produced in synchronism with the fixed frequency sample clock signal AD, which are subjected to pulse shape filtering by fixed (non-adaptive) complex pulse shape filter 14, which is responsive to the fixed frequency sample clock signal AD and to a sample clock enable signal (generated as described below). The output of filter 14 is a stream of filtered complex samples, which is provided to other system units illustrated in FIG. 1. The output of interpolator 12 is also applied to a phase error detector 16 (described in more detail below).

The output of phase error detector 16 is coupled to respective dividers 20 and 22, which in the illustrated embodiment are implemented as barrel shifters. A filter loop integral constant Ki is applied to shifter 22, and a loop proportional constant Kp is applied to shifter 20. The values of the loop integral constant Ki and the loop proportional constant Kp are calculated by the system microprocessor 268 (of FIG. 1) in a known manner and supplied to the dividers 20 and 22 respectively. The output of divider 20 is coupled to a first input terminal of an adder 24. The output of adder 24 is coupled to a delay unit 26, and the output of the delay unit 26 is coupled to a second input terminal of the adder 24 and a first input terminal of an adder 28. The signal from divider 20 is summed in adder 24 with a delayed version of that signal from the delay 26. The output terminal of the divider 22 is coupled to a second input terminal of the adder 28. The signal from delay unit 26 is summed in adder 28 with the output of divider 22. The output of adder 28 is inverted with unity gain by inverter unit 30. The first and second dividers, 20 and 22, the adders 24 and 28, the delay unit 26 and the inverter unit 30, in combination, form a second order loop filter. The output of the inverter unit 30 forms the output of the loop filter. This output represents the difference between the interpolated time when the sample from the interpolator 12 was produced, and the ideal sampling time synchronized to the transmitter clock.

A nominal delay register 31 receives a value from the system microprocessor 268 of FIG. 1 representing a nominal or expected time delay between transmitter synchronized sampling times. This nominal delay value is calculated by the system microprocessor in a manner to be described in more detail below. In the illustrated embodiment, the received signal is sampled at twice the symbol rate, so the nominal delay between the sampling signals is one half the expected interval between transmitted symbols. The output of the nominal delay register 31 is coupled to a first input terminal of a summer 32. The output of the loop filter is summed with the predetermined nominal delay value in summer 32. The output signal from summer 32 is a digital signal which represents the instantaneous delay value between samples as synchronized with the transmitter symbol clock. The nominal delay register 31 is provided to allow the receiver timing loop to initially closely approximate the incoming symbol rate in order to speed acquisition. The pull-in range of the system is limited only by the characteristics of the phase error detector 16.

The value of the signal from summer 32 is expressed in terms of a number of fixed frequency clock periods, and contains an integer portion representing the number of full fixed frequency clock pulses between sampling times, and a fractional portion, representing the sampling time between two adjacent fixed frequency samples. In the illustrated embodiment, the digital signal from the summer 32 is a 22-bit fixed point digital signal with the two most significant bits carrying the integer portion and the remaining bits carrying the fractional portion. The system microprocessor (of FIG. 1) inserts a value into the nominal delay register 31 in the following manner. First the nominal delay register 31 has a logical '1' valued signal inserted into it. Then that signal is shifted left 20 places. This places a logic '1' signal in the least significant bit of the integer portion. This may be expressed by the digital logic expression:

$$1<<RS-IS \qquad (1)$$

where RS is the nominal delay register size, e.g. 22 bits in the illustrated embodiment, and IS is the size of the integer portion, e.g. 2 bits in the present embodiment. In the illustrated embodiment this expression becomes:

$$1<<(22-2) \qquad (2)$$

Then, a calculation is made by the system microprocessor to determine the nominal delay between transmitter synchronized samples expressed as a number of fixed frequency clock periods:

$$D=FR/(2.S) \qquad (3)$$

where D is the nominal delay between transmitter synchronized symbols expressed as a number of fixed frequency clock periods, FR is the fixed frequency clock frequency, and S is the transmitter symbol frequency.

The result of this calculation is combined with the previous contents of the nominal delay register 31. In order to compensate for the value '1' already inserted into the nominal delay register 31 by the results of expressions (1) and/or (2), the value 1 must be subtracted from the nominal delay value D calculated in equation (3). Thus, the expression describing the nominal delay value placed in the nominal delay register 31 by the system microprocessor (of FIG. 1) is:

$$DR_{31}=(1<<(22-2)).(FR/(2.S)-1) \qquad (4)$$

where $DR_{31}$ is the value stored in nominal delay register 31 by the system microprocessor.

The output signal from summer 32 is applied to one input of a multiplexer 34. The other multiplexer input receives a value representing a value of −1. An adder 36 receives a first input from the output of multiplexer 34. The output of adder 36 is coupled to a delay unit 38 which functions as an accumulator. The accumulator 38 is clocked by the fixed frequency sample clock signal AD; the same clock signal that drives the ADC 10. The output of the delay unit 38 is a digital signal MU representing a time delay to the next transmitter synchronized sample. The digital signal MU contains an integer portion representing the number of periods of the fixed frequency clock signal AD until the next transmitter synchronized sample, and a fractional portion representing the time delay from the last such fixed frequency clock signal until the time for the transmitter synchronized sample.

In the illustrated embodiment, the digital signal MU is a 22-bit fixed point digital signal with the two most significant bits carrying the integer portion and the remaining bits carrying the fractional portion. One skilled in the art of digital arithmetic circuitry will understand that different sizes and formats could be used. For example, in a QAM receiver, a 26 bit digital signal is used to represent the time delay. The time delay signal MU is supplied to an integer portion selector 40, which selects the two most significant bits from the signal MU (MU:0–1). The integer portion is supplied to a comparison circuit 41, which compares the integer to a zero-valued signal, and generates a signal when the integer portion is equal to zero. The time delay signal MU is also supplied to a fractional portion selector 48 which generates a signal containing the eight most significant bits of the fractional portion of the signal MU (MU:2–9), i.e. the most significant byte of the fractional portion of the time delay signal MU. This most significant byte of the fractional portion is coupled to a control input terminal of the interpolator 12. The full 22-bit time delay signal MU is coupled to a second input terminal of the adder 36.

The output of the comparator 41 is applied to a control input of the multiplexer 34 and to a delay element 42. Delay element 42 provides a delay necessary to match the delay between the time delay signal MU and the corresponding output of the phase detector 16 generated in response to that time delay signal MU (discussed in more detail below). The output of time delay element 42 is the sample clock enable signal, and is supplied to an input terminal of a modulo-2 counter 44, and to a first input terminal of an AND gate 46. An output terminal of the modulo-2 counter 44 is coupled to a second input terminal of the AND gate 46. The output of AND gate 46 produces a symbol clock enable signal. Modulo-2 counter 44 includes, for example, a D-type flip flop and in this example divides by 2. This operation is used in this application where two samples per symbol are provided. In other applications, such as where four samples per symbol are used, counter 44 would be a modulo-4 counter, and provide a divide by 4 function.

In operation, the frequency of the fixed frequency sample clock AD is slightly higher than twice the highest expected transmitter symbol frequency. The system microprocessor 268 (of FIG. 1) computes the nominal or expected sample time period for the symbol rate of the signal currently being received, and loads the nominal delay register 31 with this value. This starts the operation of the numerically controlled delay (NCD) at approximately the correct sample period. The phase error detector 16 and associated loop filter cooperate to adjust and lock the NCD to the actual sample rate of the transmitted signal. The sample clock enable signal from the delay element 42, and the symbol clock enable signal from the AND gate 46 are used by other processing elements in the receiver (illustrated in FIG. 1). For example, the pulse shaping filter 14 (of FIG. 2) receives both the fixed frequency sample clock AD and the sample enable clock signal.

As described above, the summer 32 produces a digital signal representing the instantaneous time delay from the last transmitter synchronized sample until the next transmitter synchronized sample, and the NCD accumulator 38 produces a digital signal representing the time remaining until the next transmitter synchronized sample time. In the illustrated embodiment these time representative signals are represented by a fixed point 22-bit binary word with the two most significant bits carrying the integer portion, and the remaining bits carrying the fractional portion. The time value represented by these signals is expressed in terms of periods of the fixed frequency sample clock AD. Such a time representative signal has a range from 0 to $4-2^{-20}$. For example, a "1" value represents one period of the fixed frequency sample clock AD, and has the value $0100000000000000000000_2$, in which the subscript 2 denotes that the value is represented in the base 2, or binary, format.

If the integer portion of the time delay stored in the accumulator 38 is greater than zero, the output of the comparator 41 is a logic '0' signal. In this condition, more than one fixed frequency sample clock AD cycle must elapse before the next transmitter synchronized sample is to be taken. The integer portion of the accumulator 38 value is counted down. The multiplexer 34 is conditioned by logic '0' signal at the comparator 41 to couple the −1 valued signal to the adder 36. The adder 36, in turn, adds the −1 signal to (i.e. subtracts one from) the value of the signal in the accumulator 38, and stores the newly decremented value in the accumulator 38. In addition, because the output of the comparator 41 is a logic '0' signal, neither the sample clock enable signal nor the symbol clock enable signal (both suitably delayed by the delay unit 42) are active.

The fractional part of the accumulator 38 value represents the fraction of a fixed frequency sample clock AD cycle until the next transmitter synchronized sample is to be taken. The most significant eight bits of the fractional part are used to control the interpolator 12 delay. This essentially divides the time period between fixed frequency sample clock AD cycles into 256 parts. Thus, the interpolator could be a 256 phase polyphase filter bank. When there are no further complete fixed frequency sample clock AD cycles remaining until the next transmitter synchronized sample is to be taken, the integer portion of the signal in accumulator 38 is 0. In this case, the output signal from the comparator 41 is a logic '1' signal.

When the output signal from the comparator 41 is a logic '1' signal, a sample is taken from the interpolator 12 at a time controlled by the most significant byte of the fractional part of the accumulator 38 value, and a sample clock enable signal is generated to enable the downstream circuitry to clock in and process this newly generated sample. In addition, the modulo-2 counter 44 is clocked, and, if it is a transmitter symbol time, the AND gate 46 produces a symbol clock enable signal as well. At the same time, the multiplexer 34 is conditioned to pass the signal from the summer 32 to the adder 36. The adder 36 combines the desired transmitter synchronized sampling time and the fractional part from the NCD accumulator 38 (the integer portion is zero, as described above) so that the time when the next transmitter synchronized sample is to be taken is placed in the accumulator 38. The loop is closed by the NCD value changing in response to the phase error detector 16 output signal via the loop filter.

The sample clock enable signal is supplied to system elements such as units 14, 16, 26, 44 and 46, and all other downstream processing units (of FIG. 1) which process each transmitter synchronized sample. Such units require the sample enable signal in addition to fixed frequency sample clock signal AD. The symbol clock enable signal is active for transmitter synchronized samples taken at transmitted symbol times. The symbol clock enable signal is supplied to those system elements which operate on transmitted symbols, for example, decision directed elements associated with the carrier recovery network such as carrier recovery unit 264 (of FIG. 1). Such elements operate in response to both the fixed frequency sample clock signal AD and the symbol clock enable signal.

For example, if the illustrated embodiment is adapted for use in a satellite broadcasting system (e.g. Satlink) the frequency of the fixed frequency sample clock signal AD is made 62 MHz. The symbol rate of an exemplary broadcast signal is 30 MSymbols/sec. Because the received signal is sampled at twice the symbol rate, The sample clock enable signal disables the fixed frequency clock signal AD in such a manner as to bring the average sample rate to the desired sample rate of 2 samples per symbol. Thus, for 30 MSymbols/sec there will be 60 MSamples/sec, and 2 million disabled fixed frequency sample clock AD cycles per second. The interpolator 12 produces interpolated samples such that on each enabled fixed frequency sample clock AD cycle, the sample appears to have been taken at the desired transmitter synchronized sample time. That is, the samples from the interpolator 12 have values as if the samples were taken from an ADC 10 which was clocked at the appropriate sampling frequency, 60 MHz in this example. The samples appear on the transitions of the 62 MHz fixed frequency clock signal AD, with occasional skipped clock signals (2 million per second).

When the disclosed system is used to process a QPSK input signal, the bit error rate was observed to degrade by no more than 0.1 dB at the 4 dB signal-to-noise (SNR) threshold near where error correcting codes often become ineffective. The timing control loop fully converged within 3000 samples. The loop appeared to converge at 0 dB SNR, with about 0.5 dB degradation. These performance characteristics indicate that the disclosed timing recovery system is also suitable for use with a vestigial sideband (VSB) modulated input signal of the type proposed for use with the Grand Alliance HDTV system. The following table summarizes the system performance for certain SR ratios, where the SR ratio is the ratio of the fixed frequency sample rate (analog-to-digital conversion rate) to the symbol rate, using two samples per symbol.

| SR Ratio | SNR  | Degradation |
|----------|------|-------------|
| 62/30    | 9 dB | 0.2 dB      |
| 62/30    | 6 dB | 0.05 dB     |
| 62/30    | 4 dB | 0.1 dB      |
| 62/20    | 9 dB | 0.1 dB      |
| 62/20    | 6 dB | 0.00 dB     |
| 62/20    | 4 dB | 0.04 dB     |

In systems, such as QAM systems, which sample the input signal in both the in-phase (I) and quadrature (Q) components, it is possible to sample the input I and Q quadrature signals at less than twice the symbol rate with the present system, and to generate a digital sequence of transmitter synchronized samples at twice the transmitter synchronized symbol rate, provided that the fixed frequency sample clock signal AD rate is greater than a value defined by the equation:

$$FR = S \times BW_E + M \quad (5)$$

where FR is the fixed frequency clock signal AD rate; S is the symbol rate; $BW_E$ is an excess bandwidth fraction; and M is a margin for the flat amplitude and group delay bandwidth of the interpolator. In systems with small excess bandwidths, this could reduce A/D sample rates by 10%–30% (49.9% under ideal conditions). The digital processing system after the interpolator would need to process multiple samples per unit clock, so it would need to operate at a higher clock rate or process data using a parallel method.

Figure 3:
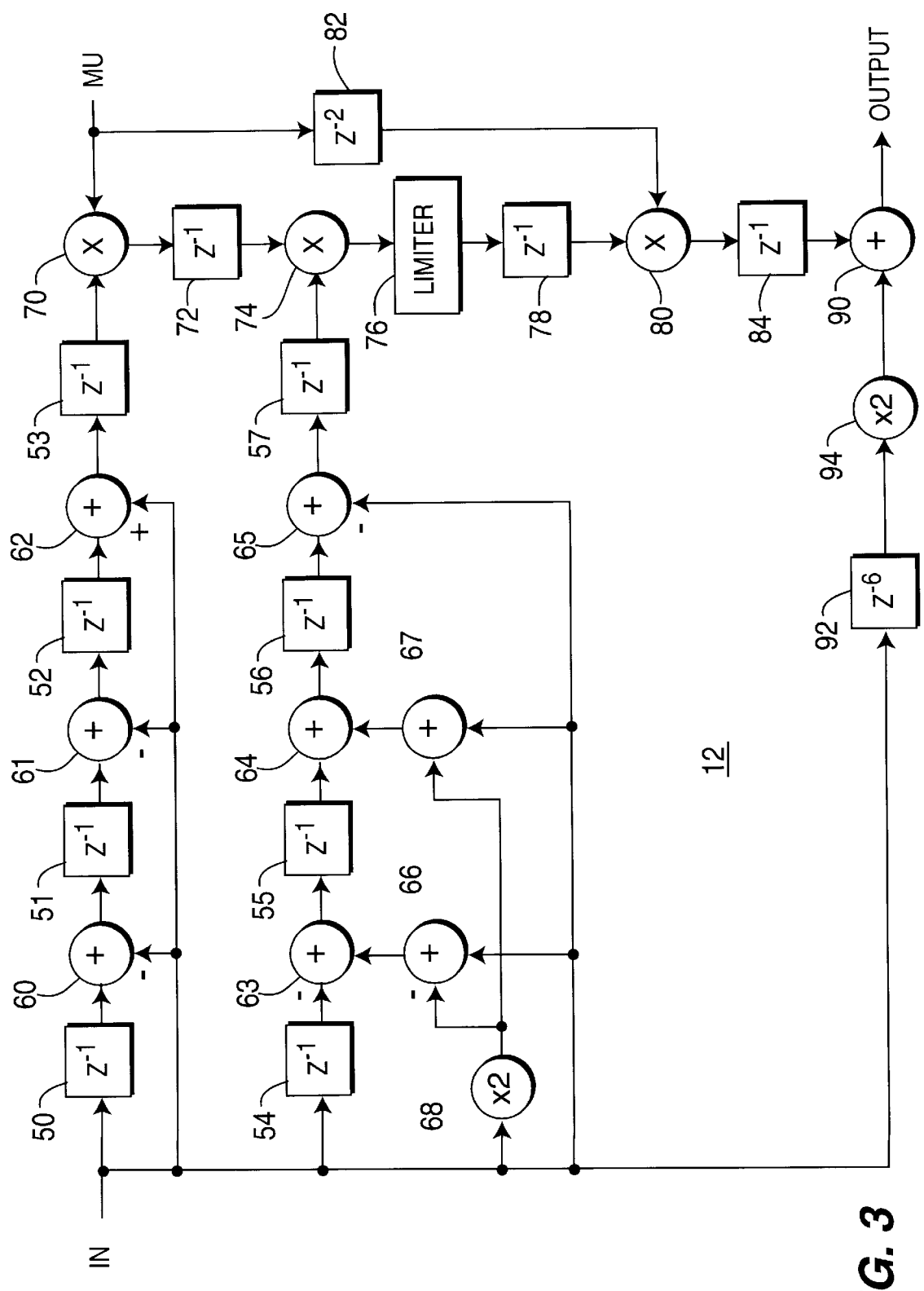
FIG. 3 is a more detailed block diagram of an interpolator used in the system of FIG. 2.

FIG. 3 illustrates a Farrow architecture piecewise parabolic interpolator 12 (of FIG. 2) implemented in fixed point arithmetic for hardware design. The interpolator 12 uses a piecewise parabolic filter because, in this example, it provides a low complexity interpolator with adequate performance. For higher order constellations such as 64 QAM or 256 QAM, a more complex interpolation filter may be needed. The addition of a nominal delay signal to the output signal from the loop filter, as shown in summer 32 (of FIG. 2), advantageously lets the system microprocessor (not shown) control the nominal delay between the desired transmitter synchronized samples, and the loop only needs to hold the rate.

Specifically, the interpolator 12 of FIG. 3 is a 4-tap piecewise parabolic filter of the type suggested by Lars, et al. in *Interpolation in Digital Modems, Part II: Implementation and Performance*, IEEE Transactions on Communications. In FIG. 3, an input terminal IN is coupled to the output terminal of the ADC 10 (of FIG. 2). The input terminal IN receives a 6-bit sample, carrying a range of values from −32 to +31, and is coupled to: a series connection of a delay element 50, a summer 60, a delay element 51, a summer 61, a delay element 52, a summer 62, and a delay element 53; and a series connection of a delay element 54, an inverting input terminal of a summer 63, a delay element 55, a summer 64, a delay element 56, a summer 65, and a delay element 57. The input terminal IN is also coupled to respective inverting input terminals of the summers 60, 61 and 65, and to a non-inverting input terminal of summer 62. The input terminal IN is also coupled to an input terminal of a ×2 multiplier 68, whose output terminal is coupled to non-inverting input terminal of an adder 67 and an inverting input terminal of an adder 66. Adder 66 is coupled to an input terminal of the adder 63 and adder 67 is coupled to an input terminal of the adder 64. The input terminal IN is also coupled to respective non-inverting second input terminals of the adders 66 and 67. The input terminal IN is further coupled to a series connection of a six time period delay element 92 and a ×2 multiplier 94.

A control input terminal MU is coupled to the most significant byte of the fractional portion of the accumulator 38 of the numerically controlled delay (of FIG. 2). Control input terminal MU is coupled to a series connection of a multiplier 70, a delay element 72, a multiplier 74, a limiter 76, a delay element 78, a multiplier 80, a delay element 84, and an adder 90. An output terminal of the delay element 53 is coupled to a second input terminal of the multiplier 70; an output terminal of the delay element 57 is coupled to a second input terminal of the multiplier 74; and an output terminal of the ×2 multiplier 94 is coupled to a second input terminal of the adder 90. A two period delay element 82 is coupled between the control input terminal MU and a second input terminal of the multiplier 80. An output terminal from the adder 90 produces the transmitter synchronized sample, and is coupled to the output terminal OUTPUT. The output terminal OUTPUT is coupled to the pulse shaping filter 14 (of FIG. 2).

The interpolator 12 illustrated in FIG. 3 operates in a manner described in the Lars et al. article discussed above. The control signal MU represents a fractional time between adjacent fixed frequency sample clock AD cycles from which a transmitter synchronized sample is to be taken. The interpolator 12 illustrated in FIG. 3 operates to interpolate among adjacent ADC 10 samples at the time represented by the control signal MU to produce an interpolated sample at the output terminal OUTPUT. In the illustrated embodiment, there is a three fixed frequency clock signal AD period delay from the control signal MU input to the interpolated sample output. This delay must be compensated for in the generation of the sample and symbol clock enable signals produced by the numerically controlled delay (of FIG. 2). The delay element 42 (of FIG. 2) provides this time compensation, and in the illustrated embodiment is a three clock cycle delay element.

Figure 4:
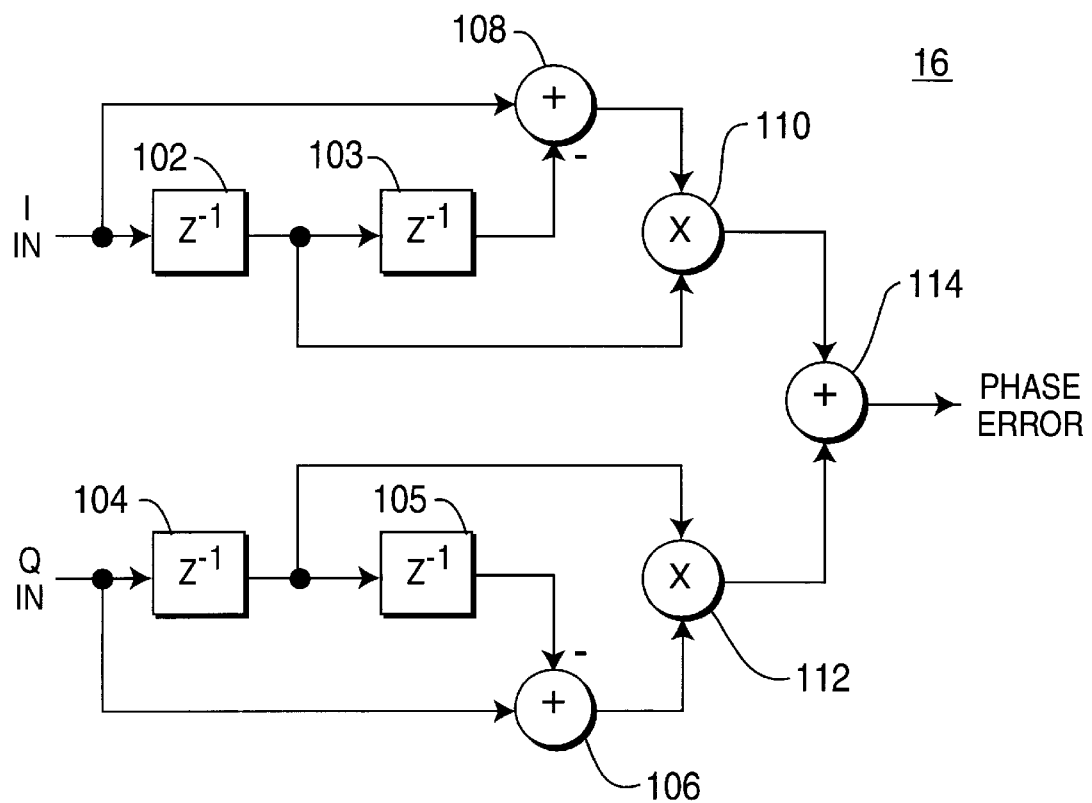
FIG. 4 is a more detailed block diagram of a phase error detector used in the system of FIG. 2.

FIG. 4 is a more detailed block diagram of the phase error detector 16 of FIG. 2. In FIG. 4, mutually quadrature phased in-phase (I) and quadrature (Q) signal input terminals I IN and Q IN are coupled to corresponding output terminals of the interpolator 12 (of FIG. 2). The in-phase input terminal I IN is coupled to a series connection of a delay element 102, a delay element 103 and an inverting input terminal of a summer 108. The in-phase input terminal I IN is also coupled a second input terminal of the summer 108. An output terminal of the summer 108 is coupled to a first input terminal of a multiplier 110, and an output terminal of the delay element 102 is coupled to a second input terminal of the multiplier 110. An output terminal of the multiplier 110 is coupled to a first input terminal of a summer 114.

The quadrature input terminal Q IN is coupled to a series connection of a delay element 104, a delay element 105 and an inverting input terminal of a summer 106. The quadrature input terminal Q IN is also coupled to a second input terminal of the summer 106. An output terminal of the summer 106 is coupled to a first input terminal of a multiplier 112, and an output terminal of the delay element 104 is coupled to a second input terminal of the multiplier 112. An output terminal of the multiplier 112 is coupled to a second input terminal of the summer 114. An output terminal of the summer 114 produces a signal representing the phase error between the transmitter synchronized sampling signal generated by the numerically controlled delay element in the receiver, and the actual sampling time of the transmitted signal, all in a known manner.

The timing recovery system described herein advantageously is capable of processing a multiple symbol rate input signal in association with a single clock produced by a fixed frequency oscillator. In addition, both sample clock enable and symbol clock enable signals are derived from the input signal itself. As explained elsewhere in the text, the sample clock enable signal indicates an interpolator output samples at a rate that is a multiple of the symbol rate.

The disclosed system advantageously supports multiple input sample rates with one fixed pulse shaping filter 14 and a fixed frequency clock oscillator 261. The configuration of filter 14 need not be adapted to accommodate the multiple input symbol rates. Pulse shaping filter 14, located after the timing recovery network, filters the signal with the same pulse shaping characteristic, thereby enhancing its signal to noise performance.

The symbol timing recovery system according to the present invention is applicable to BPSK, QPSK, CAP and QAM, for example, as well as to VSB modulation systems such as employed by the Grand Alliance High Definition Television (HDTV) system proposed for use in the United States. One skilled in the art will recognize what design changes are required to adapt the disclosed symbol timing recovery system to the desired modulation, and will understand how to design the illustrated components to operate with the desired modulation. The system illustrated above has been observed to acquire lock in a relatively short period of time. A QPSK symbol constellation has been observed to lock after a few thousand samples, and the constellation is visible after 500 samples even with a 1000 ppm timing offset. These performance attributes, coupled with reduced hardware requirements due to performing the voltage controlled oscillator function digitally, make the system attractive for use even when the system is intended to operate with respect to a single symbol rate.

In the disclosed embodiment the sample clock enable signal enables and disables clock signal AD via clock enable/disable terminals on the respective units, rather than enabling and disabling fixed frequency oscillator 261 itself. Gating the clock is also an option and may be considered in accordance with the requirements of a particular system.

What is claimed is:

1. A timing recovery network in a digital signal processing system for receiving a signal representing successive symbols from a transmitter, comprising:

a source of samples representing the received signal;

an interpolator, coupled to the sample source and responsive to a control signal representing a predetermined delay signal from a controlled delay network, for producing samples taken at times synchronized to the successive symbols from the transmitter; and a control network for providing said control signal, said control network including said controlled delay network responsive to (a) an output signal from said interpolator and to (b) a nominal delay offset signal.

2. The timing recovery network according to claim 1, wherein:

said samples are taken at a fixed frequency.

3. The system of claim 2 wherein the fixed frequency is higher than twice a transmitter synchronized sample rate.

4. The system of claim 3 wherein the fixed frequency is 62 MHz and the transmitter synchronized symbol rate is 30 MSymbols/sec.

5. The system of claim 3 wherein the fixed frequency is 62 MHz and the transmitter synchronized symbol rate is 20 MSymbols/sec.

6. A timing recovery system for a receiver, receiving a signal representing successive symbols from a transmitter, comprising:

a source of samples representing the received signal;

an interpolator, coupled to the sample source and responsive to a control signal representing a predetermined delay signal from a numerically controlled delay, for producing samples taken at times synchronized to the successive symbols from the transmitter;

a phase error detector, coupled to the interpolator, for detecting a phase error between the sample times of the transmitter synchronized samples produced by the interpolator and times of the successive transmitter symbols;

a source of a nominal delay signal;

a summer coupled to the phase error detector and the nominal delay signal source; and said numerically controlled delay, coupled to the summer, for producing the control signal for the interpolator.

7. The system of claim 6 wherein the numerically controlled delay comprises:

an accumulator for holding a signal representing the time remaining before a next transmitter synchronized sample is to be taken by the interpolator;

circuitry, coupled to the accumulator, for generating a transmitter synchronized sample clock enable signal when a transmitter synchronized sample is to be taken; and circuitry, coupled to the accumulator, for generating the interpolator control signal.

8. The system of claim 7, further comprising a source of a clock signal having the fixed frequency; wherein:

the accumulator comprises circuitry for holding a fixed point number having an integer portion and a fractional portion wherein the value of the number is expressed in terms of the period of the fixed frequency clock signal;

the circuitry for generating the transmitter synchronized sample clock enable signal comprises circuitry, responsive to the fixed frequency clock signal, for counting down the integer portion in the accumulator until it reaches zero; and the circuitry for generating the interpolator control signal is responsive to the fractional portion of the number in the accumulator.

9. The system of claim 6 wherein the interpolator comprises a four tap piecewise parabolic filter.

10. The system of claim 6 wherein:

the received signal represents successive symbols produced at one of a plurality of symbol rates;

the nominal delay signal source generates the nominal delay signal having a delay value corresponding to a nominal time delay between successive symbols in the received signal.

11. The system of claim 6 further comprising a loop filter coupled between the phase error detector and the summer.

* * * * *